US006538229B1

(12) United States Patent
Bogner et al.

(10) Patent No.: US 6,538,229 B1
(45) Date of Patent: Mar. 25, 2003

(54) METHOD FOR THE POSITIONALLY ACCURATE ADJUSTMENT AND FIXING OF A MICROOPTICAL ELEMENT

(75) Inventors: Georg Bogner, Hainsacker; Hans-Ludwig Althaus, Lappersdorf, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/562,260

(22) Filed: May 2, 2000

Related U.S. Application Data

(63) Continuation-in-part of application No. 09/188,728, filed on Nov. 9, 1998, now abandoned, which is a continuation of application No. PCT/DE97/00926, filed on May 7, 1997.

(30) Foreign Application Priority Data

May 8, 1996 (DE) .......................................... 196 18 533

(51) Int. Cl.⁷ ......................... H01L 21/60; B23K 26/02; B23K 1/005
(52) U.S. Cl. ............................ 219/121.64; 219/121.82; 219/121.83; 228/105
(58) Field of Search ....................... 219/121.62, 121.63, 219/121.64, 121.74, 121.77, 121.82, 121.83, 121.85; 228/105, 179.1

(56) References Cited

U.S. PATENT DOCUMENTS

| 4,327,277 A | * | 4/1982 | Daly ...................... 219/121.64 |
| 4,657,169 A | * | 4/1987 | Dostoomian et al. ....... 228/103 |
| 5,164,565 A | | 11/1992 | Addiego et al. |
| 5,231,261 A | * | 7/1993 | Duthoo .................. 219/121.74 |

FOREIGN PATENT DOCUMENTS

| EP | 0209650 A2 | | 1/1987 | |
| EP | 0326020 A2 | | 8/1989 | |
| EP | 0491192 A2 | | 6/1992 | |
| EP | 0501624 | * | 9/1992 | ............ 219/121.62 |
| JP | 61-219489 | * | 9/1986 | ............ 219/121.74 |
| JP | 63-278692 | * | 11/1988 | ............ 219/121.62 |
| JP | 2-175088 | * | 7/1990 | ............ 219/121.83 |
| JP | 3-124387 | * | 5/1991 | ............ 219/121.62 |
| NL | 9300744 | | 12/1994 | |

OTHER PUBLICATIONS

"A Scientific Guide to Surface Mount Technology", Electrochemical Publications Limited, 1988, pp. 290, 291.
"Intelligence Comes to Laser Soldering", Electronics, Jul. 10, 1986, pp. 75–77.
"Sensor–based laser scanner links solder joint integrity to production line performance", 232 Design Engineering 25, Jun. 1987, London.
"SOK–1 Laser Optical System with Television Attachment", 8164 Instruments and Experimental Techniques, vol. 30, No. 6, part 2, Nov. 1987, pp. 1494–1495.
"Electrochemical Publications Limited", C. Lea, 1988, pp. 286–302, 545.

* cited by examiner

Primary Examiner—Samuel M. Heinrich
(74) Attorney, Agent, or Firm—Laurence A. Greenberg; Werner H. Stemer; Ralph E. Locher

(57) ABSTRACT

The inventor relates to method for the posibility accurate adjustment and fixing of a microoptical element on a carrier. In this case, an optical position monitor with a camera monitors the accurate adjustment of the microoptical and an imaging optical system directed onto the microoptical and element. According to the invention, thermal radiation is fed into the position monitor and directed by the same imaging optical system onto the microchip, and in this way the thermal energy is guided to exactly the correct point.

7 Claims, 1 Drawing Sheet

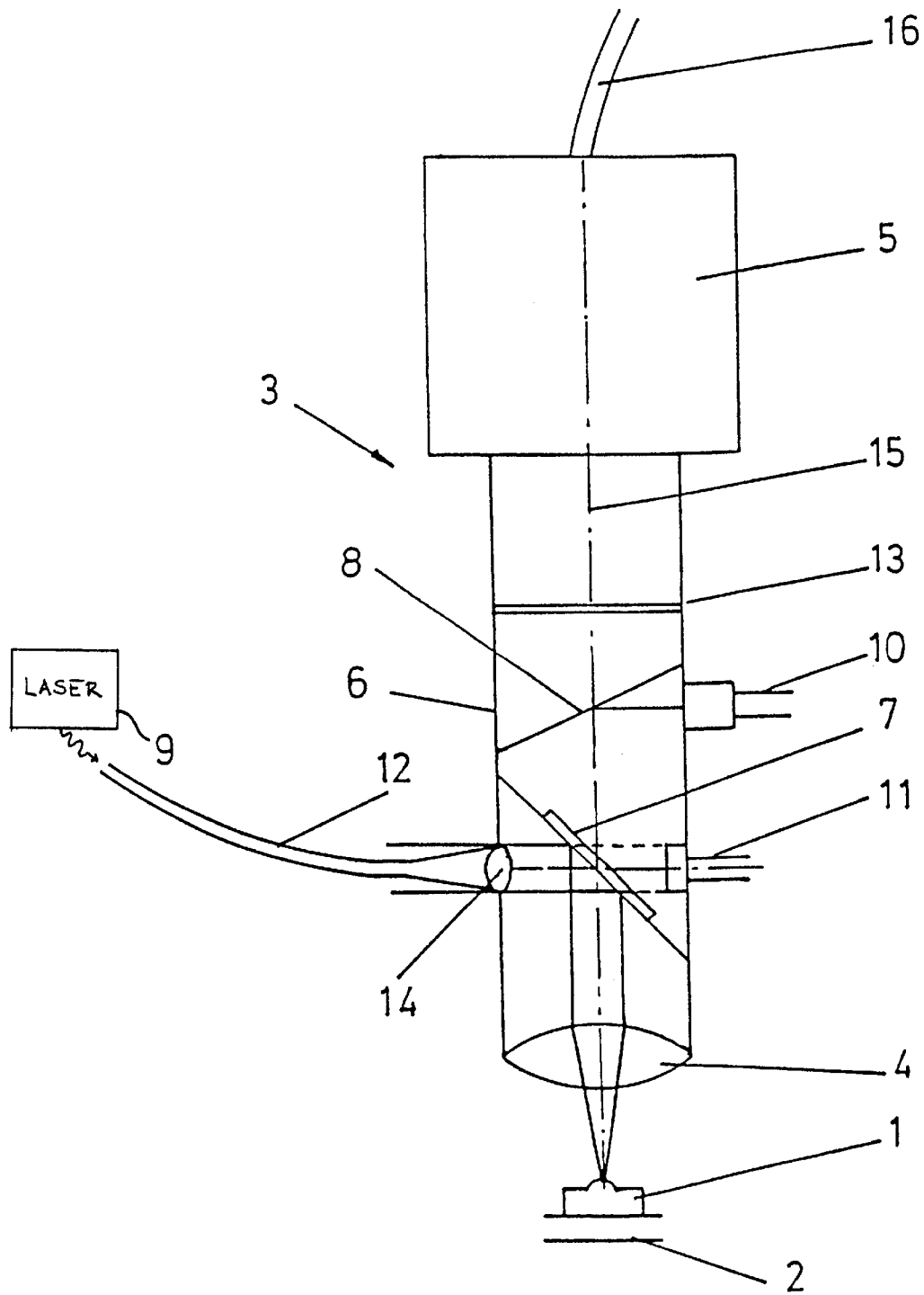

METHOD FOR THE POSITIONALLY ACCURATE ADJUSTMENT AND FIXING OF A MICROOPTICAL ELEMENT

CROSS-REFERENCE TO RELATED APPLICATIONS

This is a continuation-in-part of U.S. application No. 9/188,728, filed Nov. 9, 1998, now abandoned, which was a continuation of copending International application PCT/DE97/00926, filed May 7, 1997, which designated the United States.

BACKGROUND OF THE INVENTION

Field of the Invention:

The invention relates to a method for the positionally accurate adjustment and fixing of a microoptical element on a carrier by means of a device for the positionally accurate adjustment and fixing, having a heating device constructed as a radiant heater for supplying thermal radiation to fasten the microchip on the carrier by heating and soldering. This thermal radiation is guided through an imaging optical system onto the microchip. The device has an optical monitoring system which is assigned to the same imaging optical system.

The term microchip is to be understood broadly. For example, microchip includes semiconductor diodes and microlenses that are intended to be mounted with high accuracy on a carrier, also termed a "submount".

Known methods of the type mentioned at the beginning are distinguished in that the microchip is picked up by a suction nozzle or pincers and brought into the desired position with the aid of micromanipulators. The position is adjusted exactly with the aid of an image recognition system that usually has a camera with a tube and an imaging optical system. The image recognition system is located axially above the mounting position. The microchip is then lowered onto the appropriate carrier. The microchip and carrier are soldered or bonded to one another by heating. Resistance heating, gas heating, and radiant heating are alternate means for heating. The problem with the above-described device is that it requires a multiplicity of subcomponents for the heating source and the axial position monitor must be mounted in the relatively constricted space next to one another spatially in a unit. Another problem is that the thermal energy is not always delivered to the correct position.

Design Engineering, June, 1987, London, page 25 "Sensor Based Laser Scanner Links. . ."teaches to use a laser as a radiant heater to fix a microchip onto a carrier and to guide the thermal radiation through the imaging optical system of an optical position monitor.

Both the camera and the exit optics of the laser beam from a fiber cable are arranged at the side next to the optical path of the imaging optical system. In this system, the optical radiation of the position monitor and the thermal radiation of the laser must be reflected into the beam path of the imaging optical system via inclined semitransparent mirrors. A detector for infrared light is arranged directly in the beam path of the imaging optical system. The detector studies characteristic radiation curves on the IR radiation, which allows the quality of the solder joints to be monitored. The IR radiation passes from the imaging optical system through the two semitransparent mirrors into the IR detector. The thermal radiation is thus first directed from the laser, via a beam splitter onto the component, and reflected from there. Only the reflected thermal radiation passes, as governed by the system, through the beam splitter of the laser and the beam splitter of the monitoring camera to the IR detector.

This arrangement has the disadvantage that readjustment of the thermal radiation cannot be performed until solder joints have actually been produced and analyzed. In the case of wrongly adjusted thermal radiation, the system cannot react before faulty soldering joints have been formed. This results in waste.

*Instruments And Experimental Techniques*, vol. 30, No. 6, part 2, November, 1987, pages 1494 to 1495 teaches not to fit an IR detector in the case of an arrangement of the generic type, but rather to fit a viewing optical system via which an operator can view the solder junction. A rotating mirror allows light to enter from the imaging optical system. An optical filter is situated in the path of the reflected thermal radiation upstream from the viewing optical system and the input of a monitoring camera.

Similar devices of the type described above are also known from EP 0 326 020 A and EP 0 491 192 A.

SUMMARY OF THE INVENTION

The object of the invention is to specify a method that makes particularly accurate positioning, adjustment, and fixing of the microoptical element on the carrier possible using the device described in the Field of the Invention.

According to the invention, the object is achieved by the features of patent claim 1.

The essential advantage of the invention is that the thermal energy for soldering or bonding the microchip can be introduced directly to the microchip itself. The same imaging optical system can be used to observe the microchip and to control the adjusted position by means of the optical monitoring device. This configuration creates a coaxial optical output coupling for simultaneous adjustment and fixing.

The optical position monitor can be arranged on an optical axis of the imaging optical system. The thermal radiation and radiation that can be detected for the optical position monitor are supplied laterally and reflected onto the optical axis of the imaging optical system with the aid of optical elements. Mirrors or beam splitters accomplish this. Monitoring systems for monitoring and controlling the radiant power can be arranged downstream of the beam splitters. Photodiodes can be used for this purpose. The beam splitters are configured in this case such that more than ninety percent (90%) of the radiant power is directed toward the imaging optical system and only a small remainder impinges on the photodiode.

The optical position monitor has a camera, a tubular body, and an imaging optical system. The camera preferably can be arranged on the optical axis of the imaging optical system. A filter can be placed upstream of the camera. In particular, the filter can be a cut-off filter that is transparent only to the light of the optical position monitor, that is to say the visible light or infrared light, and is opaque to the wavelength of the thermal radiation. This measure effectively protects the camera from the thermal radiation of the heating device.

A laser can generate the thermal radiation. Lasers can produce the very high energy density that is required.

Particularly suitable here are NdYag lasers or a bundle-fiber high-power semiconductor laser system. A xenon vapor lamp or the like also can be used in some circumstances.

An optical conductor should be provided for supplying the thermal radiation to the device. When the light is irradiated into the tube by means of an optical conductor such as a fiber or a fiber bundle, the tube design can be very small.

In another development of the device, an optical system is provided for parallelizing and controlling the focus of the thermal radiation so that the focal positions for the thermal radiation and the monitoring radiation can be brought into conformity with each other. This optical system serves, furthermore, initially to "parallelize" the thermal radiation.

Other features that are considered as characteristic for the invention are set forth in the appended claims.

Although the invention is illustrated and described herein as embodied in method for the positionally accurate adjustment and fixing of a microoptical element, the invention is nevertheless not intended to be limited to the details shown. Various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The sole FIGURE of the drawing is a diagrammatic elevational view of a device according to the invention.

DESCRIPTION OF THE PREFERRED EMBODIMENTS

Represented in the lower part of the figure is a microchip 1 resting on a carrier 2. An optical position monitor 3 contains a camera 5, a tube 6 and an imaging optical system 4. The imaging optical system 4 has an optical axis 15 on which the camera 5 is centered. An illuminating device 10 for image recognition generates visible or infrared light. This light is fed laterally into the tube 6. A beam splitter 8 deflects this light onto the optical axis 15 in the direction of the microchip 1. The optical axis 15 extends axially in the center of the tube 6. A heating device 9 is preferably a laser. The heating device 9 generates thermal radiation that is brought laterally to the tube 6 via a fiber 12. An optical system 14 for parallelizing the thermal radiation is provided on the end of the fiber 12. The optical system 14 makes the thermal radiation fall in a parallel fashion onto a beam splitter 7. The beam splitter 7 deflects the thermal radiation by more than ninety percent (90%) in the direction of the imaging optical system 4 and microchip 1. The effect of the parallelizing optical system 14 is that the thermal radiation is likewise irradiated onto the optical axis 15 of the imaging optical system. The focal position of the thermal radiation becomes adjustable. The adjustable focal position of the thermal radiation can be in conformity with the focal position of the light for image recognition. The beam splitter 7 permits a small fraction (ten percent or less (<10%)) of the thermal radiation to pass. The small fraction of thermal radiation falls onto a monitoring system 11 that has a photodiode as essential constituent. The monitoring system 11 can measure and used to control the radiant energy as required. Provided between the lateral connections for the illuminating device and for the heater and the camera is a cut-off filter 13. The cut-off filter is transparent only to the light of the illuminating device and is opaque in the wavelength region of the heater. Moreover, the camera 5 has a connection 16 by means of which the images taken are fed to a data processing unit.

A very favorable method for adjusting and fixing microchips is possible with this device. First, the camera sets the depositing position for the microchip. The microchip is brought into this position by a micromanipulator and deposited there. A light pulse is used to fix the microchip by the optical system of the image recognition system. This ensures that the microchip is exactly positioned where the microchip is to be heated.

The term microchip hereby explicitly includes a microchip in the form of an optically passive element (microlens). A microchip made from silicon is preferably constructed as a chip with a monolithically integrated transparent lens for light wavelengths greater than one-and-one-tenth micrometers ($\lambda > 1.1$ $\mu$m) for which pure silicon is transparent. For applications in wavelength regions having light wavelengths less than one-and-one-tenth micrometer ($\lambda < 1.1$ $\mu$m), a regular opening (V-groove) which can hold an appropriately transparent lens is introduced in a corresponding microchip by micromechanical etching methods. The transparent lens is shaped in a suitable way, for example as a planar-convex, biconvex, or spherical lens. The last named embodiment of the microchip is also denoted as a hybrid integrated microchip.

Using the device described, a microchip 1 can be adjusted with particular precision as a microoptical element (microlens) relative to a light-emitting element for chip (laser diode, VCSEL, IRED, LED, etc.) or light-receiving element or chip (photodiode, photoelement, phototransistor, photo-IC, photoresistor, etc.). The device permits the optical microchip to be adjusted before being joined to an additional micromanipulator M1. Once joined, the imaging optical system fixes the optical microchip with thermal radiation that is in the adjusted arrangement without a mechanical change of location. Thereafter, the device can be brought into the next operating position. In this system, the optical microchip can be adjusted both passively and actively. In this system, soldering is a suitable means for joining the optical microchip to the additional micromanipulator M1.

During active adjustment, the adjusting operation moves the optically active element (for example laser diode into the operating position. Next, the microchip 1 is brought into the optical beam path with the aid of a micromanipulator M1. The image of the microchip 1 is transmitted via the laser radiation to the imaging optical system. Examples of the imaging optical system include but are not limited to a CCD camera and Vidicon. The resulting image is measured and compared with a desired image, which can be stored in a suitable way in the device. By means of the device, the microchip 1 is then moved manually or automatically using the micromanipulator M1 until the desired optical image is achieved. In this position, the microchip 1 is then held without additional holding by the micromanipulator M1. Next, the device is switched over to its heating function without mechanical change. For this purpose, the thermal radiation of the heating source 9 is coupled to the light-conducting fiber 12 and is automatically aligned with the microchip 1 via the semitransparent beam splitter 7 by the common imaging optical system 4. The heating source 9 is preferably constructed as a semiconductor laser array. The microchip 1 is heated by the soldering.

The micromanipulator can be eliminated when the microlens is held directly by a suitable holder. A preferred holder is a suction nozzle connected to the device. The adjusting movement is then carried out with the aid of a movable plant table.

The microchip is constructed in such a way that it has a metallization that can be soldered like a standard microchip by utilizing previously applied solder. An alternative to solder is an adhesive that hardens when exposed to light or heat. The resulting microchip made with adhesive can be processed further like a traditionally bonded microchip.

In the case of an embodiment containing a light-receiving element below the microlens or the microchip, the method proceeds *mutatis mutandis*, or in other words, in an inverse fashion. That is to say, for active adjustment light is coupled from the device into the microlens and then into a photodiode.

In the case of passive adjustment, positioning is performed in accordance with the method according to the invention via an image processing system, for example. A precision of one-tenth of a micrometer (+/−0.1 µm) is possible in the case both of active and of passive adjustment with subsequent fixing.

We claim:

1. A method for the positionally accurate adjustment and fixing of a microoptical element with a device including a carrier, an optical position monitor, an imaging optical system aligned with the microoptical element being guided by the optical position monitor, the imaging optical system storing a desired optical image, creating an optical beam path, and having a heating device for fastening the microoptical element onto the carrier by heating, the heating device being a radiant heater for supplying thermal radiation to the microoptical element; the method which comprises:

adjusting the deposited position for the microoptical element with the aid of the optical position monitor;

adjusting the microoptical element in the deposited position; and fastening the microoptical element onto the carrier in the adjusted deposited position by means of supplied thermal radiation from the heating device.

2. The method according to claim 1, further comprising:

adjusting the microoptical element with a micromanipulator on the carrier.

3. The method according to claim 1, further comprising:

bringing the microoptical element into the optical beam path;

creating an optical image of the microoptical element by reflect the optical beam off the microoptical element;

measuring the optical image of the microoptical element with the aid of the position monitor;

comparing the optical image with the described image, and adjusting the deposited position for the microoptical element until the desired optical image is achieved.

4. The method described in claim 1, wherein the microoptical element is a microchip with a monolithically integrated transparent lens.

5. The method as described in claim 1, wherein the microoptical element is a hybrid integrated microchip with an inserted transparent lens.

6. The method described in claim 1, wherein the microchip has a metallization and the imaging optical system includes a controllable semiconductor laser array generating a supplied thermal radiation.

7. The method described in claim 6, further comprising:

fastening the microoptical element by the supplied thermal radiation generated by the controllable semiconductor laser array.

* * * * *